(12) United States Patent
Metzler et al.

(10) Patent No.: US 7,615,812 B1
(45) Date of Patent: Nov. 10, 2009

(54) FIELD EFFECT SEMICONDUCTOR DIODES AND PROCESSING TECHNIQUES

(75) Inventors: Richard A. Metzler, Medina, OH (US); Frederick A. Flitsch, New Windsor, NY (US)

(73) Assignee: Integrated Discrete Devices, LLC, Costa Mesa, CA (US)

( * ) Notice: Subject to any disclaimer, the term of this patent is extended or adjusted under 35 U.S.C. 154(b) by 302 days.

(21) Appl. No.: 11/728,256

(22) Filed: Mar. 22, 2007

Related U.S. Application Data

(60) Provisional application No. 60/785,306, filed on Mar. 23, 2006, provisional application No. 60/785,307, filed on Mar. 23, 2006.

(51) Int. Cl.
*H01L 29/76* (2006.01)
*H01L 29/94* (2006.01)

(52) U.S. Cl. ...................... 257/288; 257/328

(58) Field of Classification Search ................. 257/288, 257/328, 330, 910, E21.362, E27.05, E27.051, 257/E27.073, E29.327; 438/268, 270
See application file for complete search history.

(56) References Cited

U.S. PATENT DOCUMENTS 6,537,921 B2   3/2003  Metzler
6,974,720 B2 * 12/2005 Sumakeris et al. .......... 438/105
7,323,745 B2 *  1/2008 Kinzer ....................... 257/328
7,420,246 B2 *  9/2008 Ozoe et al. .................. 257/330

* cited by examiner

*Primary Examiner*—Hung Vu
(74) *Attorney, Agent, or Firm*—Blakely Sokoloff Taylor & Zafman LLP

(57) ABSTRACT

Field effect semiconductor diodes and improved processing techniques for forming the field effect semiconductor diodes having semiconductor layers forming a source, a body and a drain of a field effect device, the semiconductor layers forming pedestals having an insulating layer and a gate on sides thereof vertically spanning the body and a part of the source and drain layers, and a conductive contact layer over the pedestals making electrical contact with the drain and the gate, the conductive layer being in contact with the body at least one position on each pedestal. The conductive layer may be in contact with the body through at least one opening in the source layer, or the source layer may be a discontinuous doped layer, the body layer extending between the discontinuous doped layer forming the source layer to be in electrical contact with the conductive layer. Other aspects and variations of the invention are disclosed.

18 Claims, 6 Drawing Sheets

FIELD EFFECT SEMICONDUCTOR DIODES AND PROCESSING TECHNIQUES

CROSS-REFERENCE TO RELATED APPLICATION

This application claims the benefit of U.S. Provisional Patent Application No. 60/785,306 filed Mar. 23, 2006 and U.S. Provisional Patent Application No. 60/785,307 filed Mar. 23, 2006.

BACKGROUND OF THE INVENTION

1. Field of the Invention

The present invention generally relates to semiconductor devices and fabrication of the same. The present invention more particularly relates to semiconductor diodes and their methods of fabrication.

2. Prior Art

Reference is made to prior art U.S. Pat. No. 6,537,921, the disclosure of which is hereby incorporated by reference. Semiconductor devices of various kinds are well known in the prior art. Because the present invention relates to semiconductor diodes and how they are fabricated, the focus of this section will be semiconductor diodes.

Semiconductor diodes are widely used in electronic circuits for various purposes. The primary purpose of such semiconductor diodes is to provide conduction of current in a forward direction in response to a forward voltage bias, and to block conduction of current in the reverse direction in response to a reverse voltage bias. This rectifying function is widely used in such circuits as power supplies of various kinds as well as in many other electronic circuits.

In typical semiconductor diodes, conduction in the forward direction is limited to leakage current values until the forward voltage bias reaches a characteristic value for the particular type of semiconductor device. By way of example, silicon pn junction diodes don't conduct significantly until the forward bias voltage is at least approximately 0.7 volts. Many silicon Schottky diodes, because of the characteristics of the Schottky barrier, can begin to conduct at lower voltages, such as 0.4 volts. Germanium pn junction diodes have a forward conduction voltage drop of approximately 0.3 volts at room temperature. However, the same are currently only rarely used, not only because of their incompatibility with silicon integrated circuit fabrication, but also even as a discrete device because of temperature sensitivity and other undesirable characteristics thereof.

In some applications, diodes are used not for their rectifying characteristics, but rather to be always forward biased so as to provide their characteristic forward conduction voltage drop. For instance, in integrated circuits, diodes or diode connected transistors are frequently used to provide a forward conduction voltage drop substantially equal to the base-emitter voltage of another transistor in the circuit. While certain embodiments of the present invention may find use in circuits of this general kind, such use is not a primary objective thereof.

In circuits, which utilize the true rectifying characteristics of semiconductor diodes, the forward conduction voltage drop of the diode is usually a substantial disadvantage. By way of specific example, in a DC to DC step-down converter, a transformer is typically used wherein a semiconductor switch controlled by an appropriate controller is used to periodically connect and disconnect the primary of the transformer with a DC power source. The secondary voltage is connected to a converter output, either through a diode for its rectifying characteristics, or through another semiconductor switch. The controller varies either the duty cycle or the frequency of the primary connection to the power source as required to maintain the desired output voltage. If a semiconductor switch is used to connect the secondary to the output, the controller also controls the operation of this second switch.

Use of a semiconductor switch to couple the secondary to the output has the advantage of a very low forward conduction voltage drop, though has the disadvantage of requiring careful control throughout the operating temperature range of the converter to maintain the efficiency of the energy transfer from primary to secondary. The use of a semiconductor diode for this purpose has the advantage of eliminating the need for control of a secondary switch, but has the disadvantage of imposing the forward conduction voltage drop of the semiconductor diode on the secondary circuit. This has at least two very substantial disadvantages. First, the forward conduction voltage drop of the semiconductor diode device can substantially reduce the efficiency of the converter. For instance, newer integrated circuits commonly used in computer systems are designed to operate using lower power supply voltages, such as 3.3 volts, 3 volts and 2.7 volts. In the case of a 3 volt power supply, the imposition of a 0.7 volt series voltage drop means that the converter is in effect operating into a 3.7 volt load, thereby limiting the efficiency of the converter to 81%, even before other circuit losses are considered.

Second, the efficiency loss described above represents a power loss in the diode, resulting in the heating thereof. This limits the power conversion capability of an integrated circuit converter, and in many applications requires the use of a discrete diode of adequate size, increasing the overall circuit size and cost.

Another commonly used circuit for AC to DC conversion is the full wave bridge rectifier usually coupled to the secondary winding of a transformer having the primary thereof driven by the AC power source. Here two diode voltage drops are imposed on the peak DC output, making the circuit particularly inefficient using conventional diodes, and increasing the heat generation of the circuit requiring dissipation through large discrete devices, heat dissipating structures, etc. depending on the DC power to be provided.

Therefore, it would be highly advantageous to have a semiconductor diode having a low forward conduction voltage drop for use as a rectifying element in circuits wherein the diode will be subjected to both forward and reverse bias voltages from time to time. While such a diode may find many applications in discrete form, it would be further desirable for such a diode to be compatible with integrated circuit fabrication techniques so that the same could be realized in integrated circuit form as part of a much larger integrated circuit. Further, while reverse current leakage is always undesirable and normally must be made up by additional forward conduction current, thereby decreasing circuit efficiency, reverse current leakage can have other and more substantial deleterious affects on some circuits. Accordingly it would also be desirable for such a semiconductor diode to further have a low reverse bias leakage current.

In many applications it is required that the diode be put across a coil such as a transformer. In these instances it is possible for a reverse voltage to be applied to the diode of sufficient magnitude to force it into reverse breakdown, specifically into a junction avalanche condition. This is particularly true in DC to DC converters which use a rapidly changing waveform to drive transformer coils which are connected across diode bridges. In these applications a specification requirement for "Avalanche Energy" capability is a parameter normally included in the data sheets. The avalanche energy capability of a diode is a significant factor for a designer of such circuits. The avalanche energy capability determines how much design margin a designer has when designing a semiconductor diode into a circuit. The larger the number of avalanche energy capability the more design flexibility a circuit designer has.

The avalanche energy capability is a measure of the diode's capability to absorb the energy from the coil, where energy $E=(\frac{1}{2})*I^2*L$, without destroying the diode. These requirements are typically on the order of tens of millijoules. A key factor in the ability of a diode to nondestructively dissipate this energy is the amount of junction area that dissipates the energy i.e., the area of the junction that actually conducts during avalanche. High avalanche energy capability of a semiconductor diode improves its utilization.

At the same time, it is desirable to lower the costs of semiconductor diodes by reducing their size and by improving their methods of fabrication.

BRIEF DESCRIPTION OF THE DRAWINGS

FIG. 4A1 is a cross section taken along line 4A1-4A1 of FIG. 4A illustrating a diode before the anode has been driven to its final depth.

FIG. 4B1 is a cross section taken alone line 4B1-4B1 of FIG. 4B.

DETAILED DESCRIPTION OF THE PREFERRED EMBODIMENTS

Figure 1:
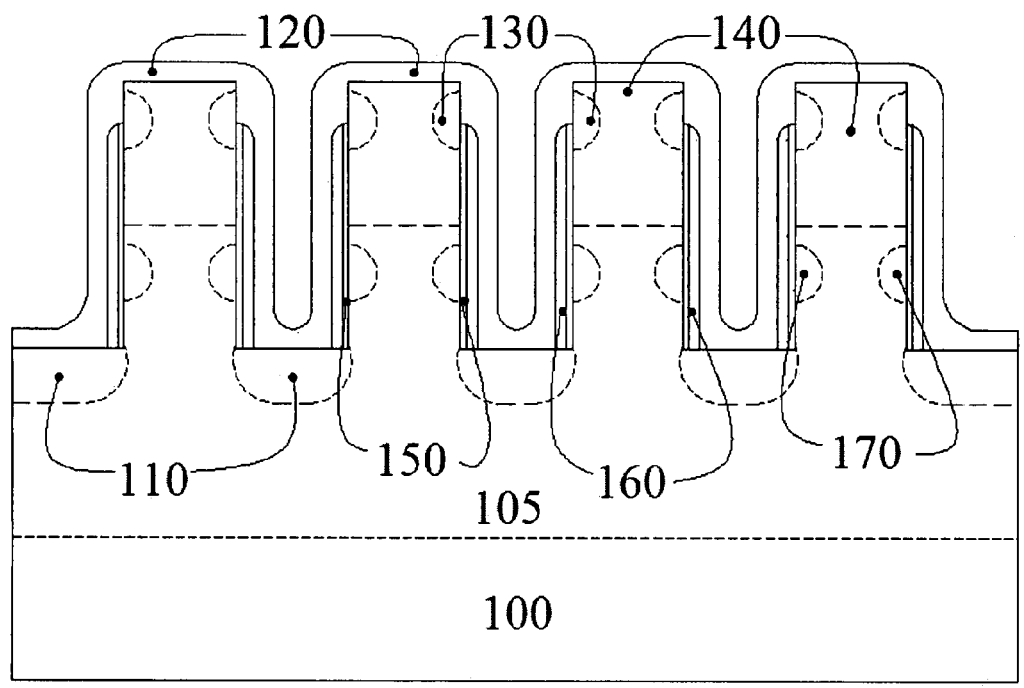
FIG. 1 is a cross section of a prior art diode of the type of interest herein taken on a plane through the pedestals perpendicular to the usually elongate pedestals.

The diodes of interest in the present invention are FET structures, as shown in prior art cross section, FIG. 1, with a common gate 160 and anode 130. These also have the FET body (backgate) 140 common to the anode and gate. For the discussion of these devices we will assume the use of an N-Channel FET. Similar discussions with P-Channel FETs would require the exchange of material conductivity types and anode/cathode terms. For completeness, 100 is the wafer substrate, 105 is the N-epitaxial region, 110 is the breakdown voltage enhancement implant region, 120 is the device anode metallization, 150 is the gate dielectric material and 170 is the cathode enhancement diffusion.

Figure 2:
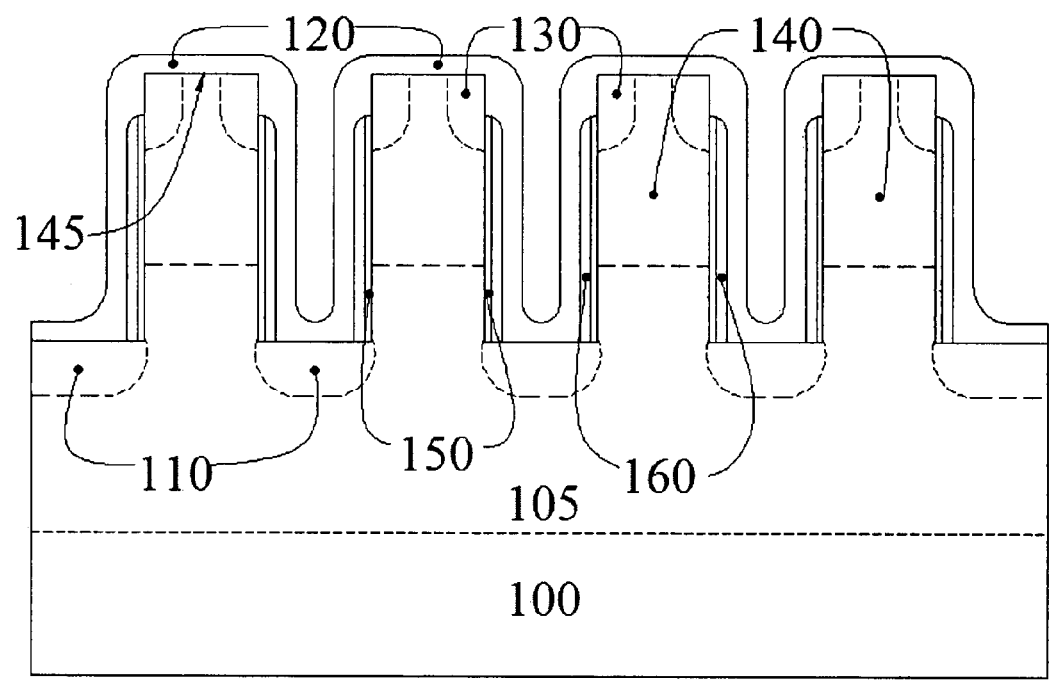
FIG. 2 is a cross section of a preferred embodiment of the present invention taken on the same plane as FIG. 1.

A cross section of the preferred embodiment of the present invention is presented in FIG. 2. The major differences from the prior art are elimination of the cathode enhancement diffusion 170, and extension of the anode diffusion 130 to the top surface. The elimination of diffusion 170 is discussed in the prior art patent hereinbefore referred to, but is included here for completeness to illustrate the alternative embodiment. Also note the specific identification of the backgate contact 145, connecting the backgate 140 to the anode metallization 120. Although the term metallization is used here, it also applies to any conductive interconnect layer which may be used to connect the electrodes such as silicide, or polysilicon. This backgate structure is formed by masking the anode implant using an oxide mask, or photoresist. The pedestals, whose cross sections are shown in the Figures, can be islands of any desired shape on top surface of the substrate, such as small circular mesas, rectangular mesas, or any desired shape of cylindrical cylinder with a height as shown in the cross section. They may also be long narrow rectangles of width approximately 0.6 microns and lengths extending the entire width or length of the die referred to as long fingers. The preferred form is long fingers.

Due to the low current required for the backgate functionality, the backgate contact may consist of isolated contacts along the length of the fingers, typically one every 20 um for a finger approximately 0.6 um wide, rather than continuous connection along the length of the fingers as shown in FIG. 2. The substrate may also be an insulator such as in SOI construction with an added contact (not shown) to access the cathode.

Figure 3A:
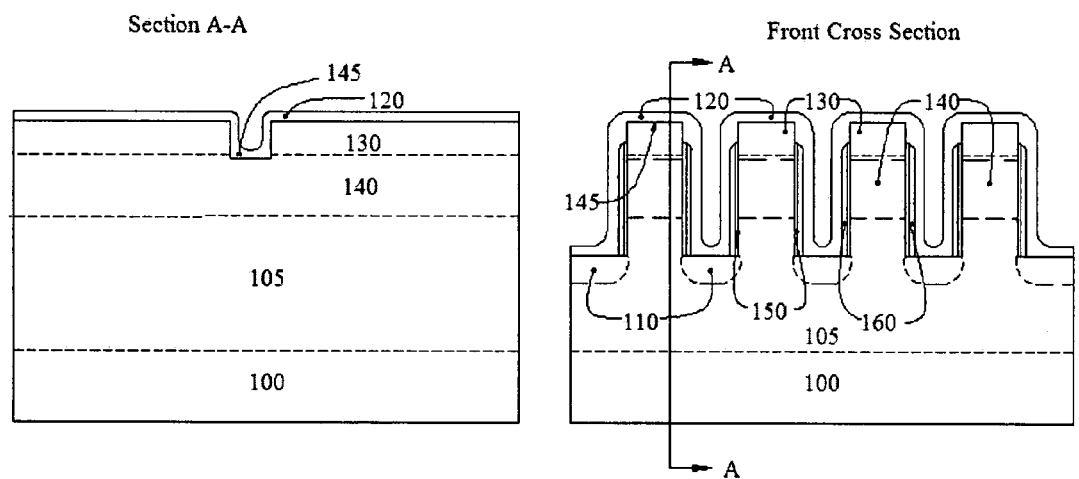
FIG. 3A is a cross section of an alternate embodiment taken on the same plane as FIG. 1, together with a cross section taken along lines A-A, both illustrating an alternative technique of forming backgate contacts.

FIG. 3A presents an alternative technique of forming these contacts. In this embodiment, the anode 130 is formed as a separate epitaxial layer, and then etched away to expose the backgate 140 and form backgate contacts 145. In lieu of growing an epitaxial layer, the anode layer may be formed by a blanket ion implantation followed by a drive. The drive may be later in the process and serve other purposes, for example the damage anneal after a silicon trench etch.

Figure 3B:
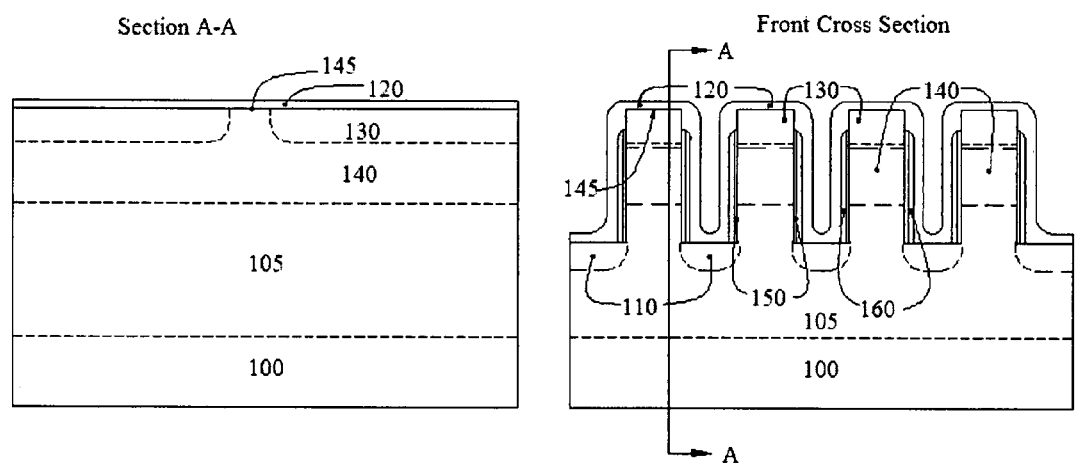
FIG. 3B is a cross section of a second alternate embodiment taken on the same plane as FIG. 1, together with a cross section taken along lines A-A, both illustrating a second alternative technique of forming backgate contacts.

FIG. 3B presents a second alternative backgate, contact by utilizing a photoresist or oxide mask to block the anode implant which after thermal treatment results in the indicated anode structure 130. This technique is somewhat simplified in comparison to the embodiment of FIG. 3A because it does not leave a step in the silicon; and is simplified in comparison to the prior art hereinbefore referred to because it does not require the separate initial trench etch required in that embodiment; however, it does require more thermal treatment, and possible shifting of diffusions which must be taken into account.

Figure 3C:
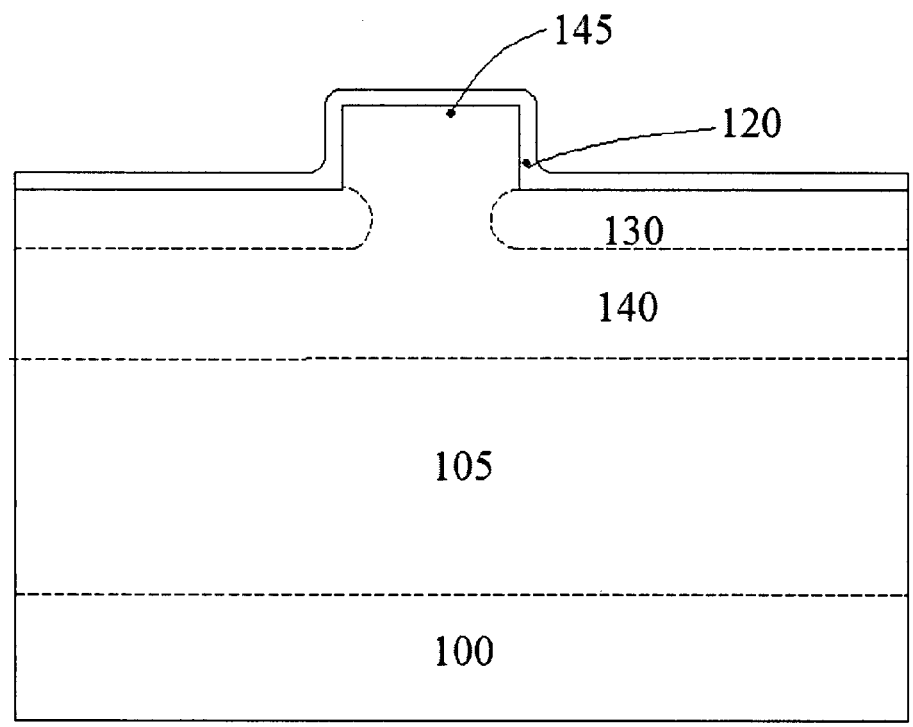
FIG. 3C is a cross section illustrating a third alternative technique of forming backgate contacts.

A third alternative embodiment is presented in FIG. 3C. In this embodiment, the oxide masking level is cut with an initial mask, used for alignment target cuts; however, since this cuts the alignment targets cut into the silicon, it results in a vertical oxide step at the backgate contact 145. There is still an oxide mask over region 145 during the anode implant which keeps the implant 130 out of the contact region. Again FIG. 3B is preferred because of the planar surface that results. The step at 145 will be imaged during the trench etches which may have an impact on device performance, unless critical mask alignment is used for the trench etch steps so that the contacts are localized to the top of the pedestals only.

It is clear that, with the various options for forming the backgate contact, there is much flexibility in the sequence of forming the overall device structure. These contacts may be formed early in the process, before any substantial wafer processing has occurred, or later after the trenches have been cut. Again, for illustrative purposes, an N-Channel device will be assumed with the understanding that P-Channel devices can also be constructed by switching material types and electrode names.

Figure 4A:
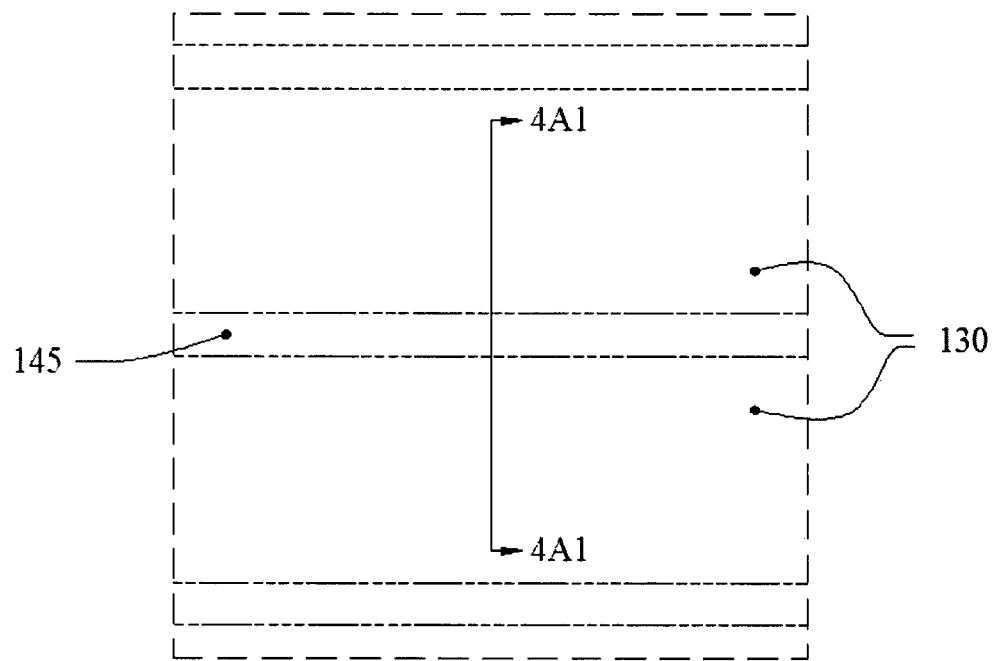
FIG. 4A is a cross section illustrating a preferred embodiment utilizing an implanted anode region with a photoresist mask to form the backgate contact regions.

For the embodiment of choice, the process begins with a low resistivity substrate, less than 0.002 Ohm-Cm. An N-buffer layer is epitaxially grown on top of this to support the reverse breakdown voltage, followed by a p-type epitaxial region where the device channel will be formed. The preferred embodiment utilizes an implanted anode region 130 with a photoresist mask to form the back contact regions 145 by selectively blocking the implant shown in top view FIG. 4A, thus leaving the p-type backgate exposed at the surface of the silicon. This results in the cross section presented in FIG. 4A1, where the anode has not yet been driven to its final depth. The anode concentration is relatively high, typically $10^{20}$/cc, to facilitate ohmic contact to metallization in a later step.

Figure 4B:
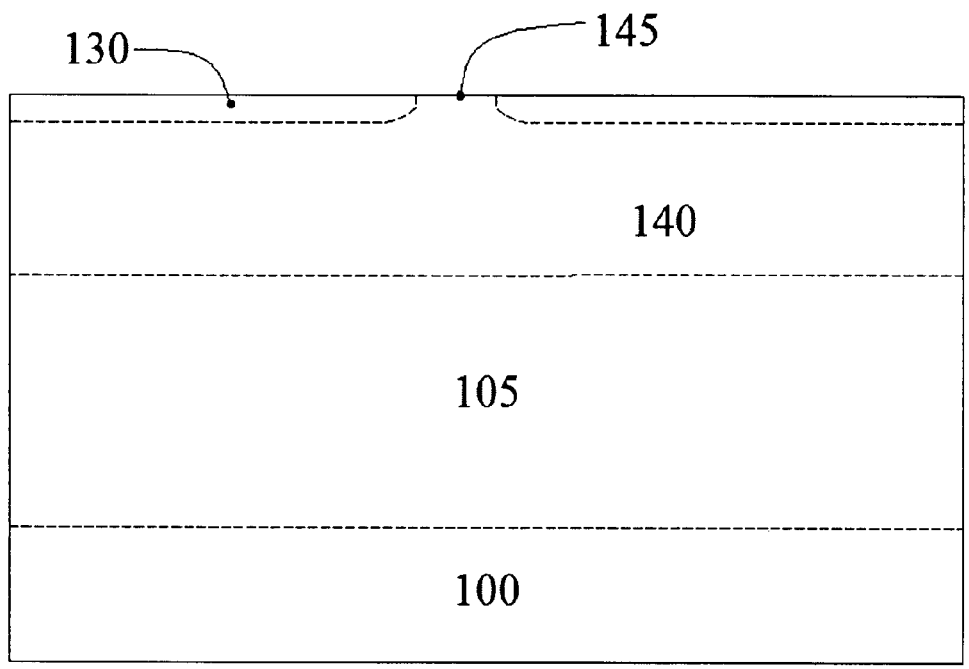
FIG. 4B is a top view illustrating the formation of pedestals for the FET devices of the present invention.
Figure 4B:
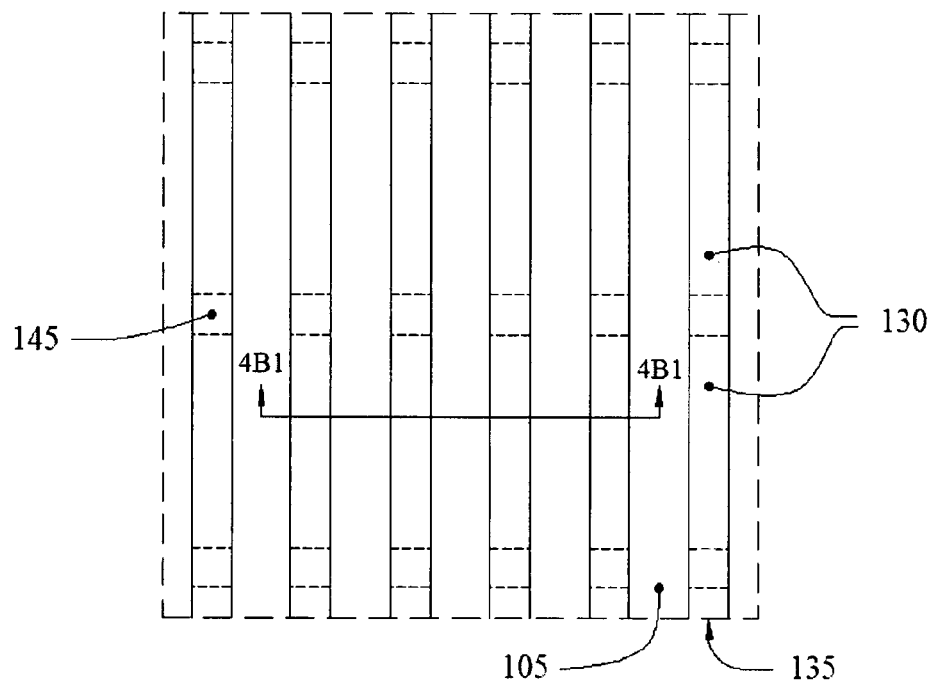

FIG. 4B presents a top view of the next step, in which trenches are cut into the silicon, through layers 130 and 140 exposing N-Type epitaxial layer 105 (cathode), to form the pedestals 135 for the FET devices. These trenches are approximately perpendicular to the contact masking as shown in FIG. 4B, although the alignment to this masking step is not critical, ±30° is acceptable. A cross section after this step is presented in FIG. 4B1. This typically is followed by an annealing process to remove any residual etch damage, and to drive the anode slightly deeper. It will be noted that the trench etch extends below the backgate silicon 140 to provide a surface for the FET gate construction. FIG. 4B also presents the relationship among the substrate 100, the N-epitaxial layer 105 (cathode), the backgate region 140, and the implanted anode 130 at the end of these steps. It is understood that the intermediate steps of forming and patterning the oxide mask necessary for the trench etch, which are presented in the referenced patent, are included here by that reference.

Figure 4C:
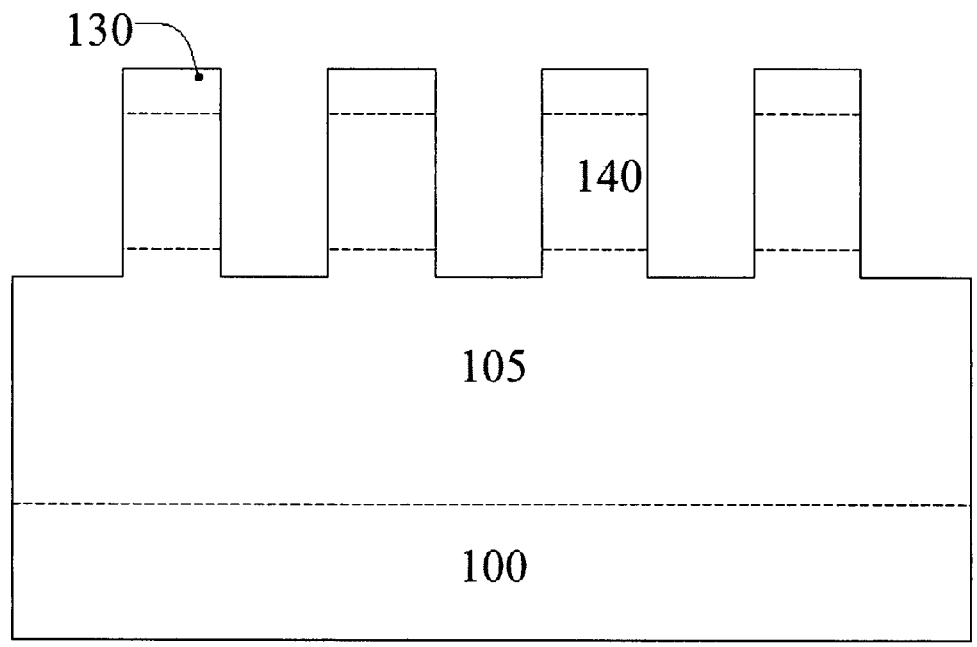
FIG. 4C is a cross section illustrating the implantation of the threshold adjustment.
Figure 4C:
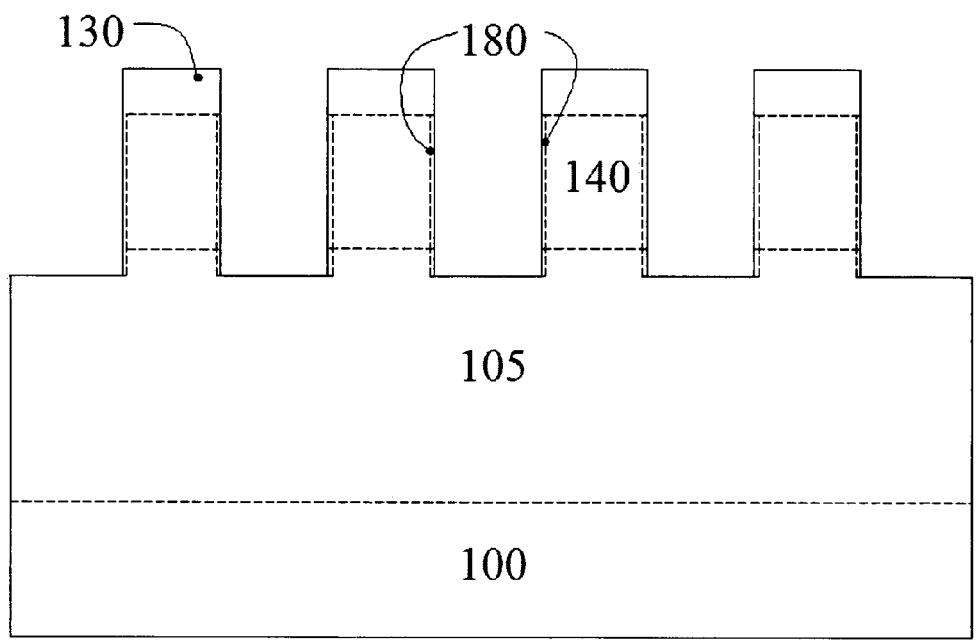
Figure 4D:
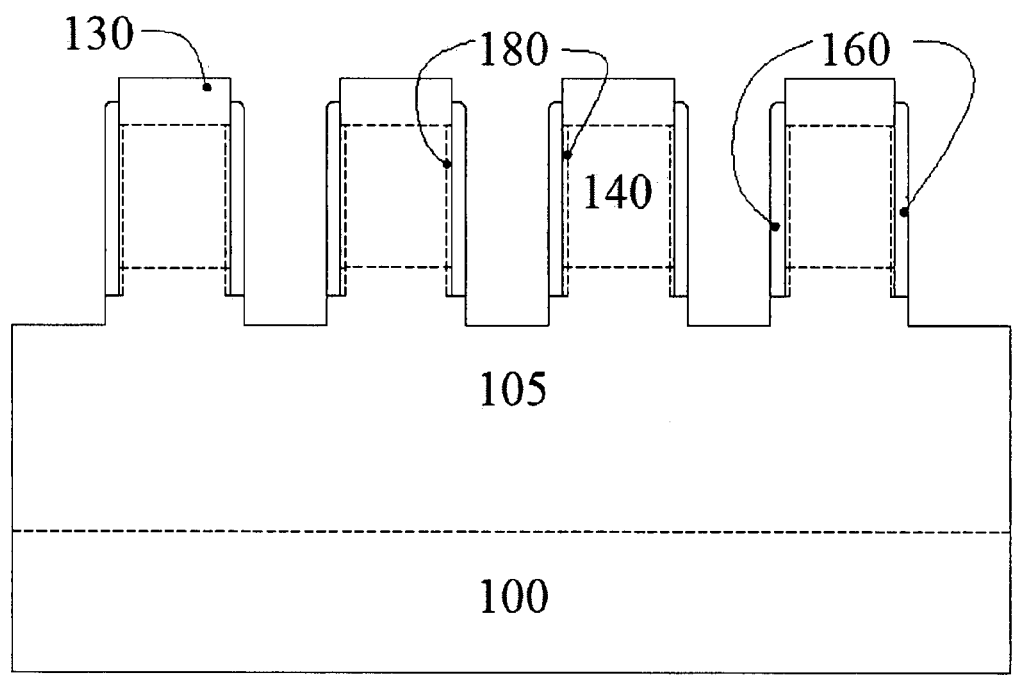
FIG. 4D is a cross section illustrating the formation of the FET gate.

FIG. 4C presents the next step where the threshold adjustment 180 is implanted into the side walls at an angle, typically 15° from the vertical on each of the two pedestal walls. This may be done through a sacrificial oxide as is usual in the industry to provide some additional resistance to implant channeling. After striping the sacrificial oxide, if used, a gate oxidation step follows, and the application of gate electrode material to the pedestal wall forms the FET gate 190, FIG. 4D. Heavily doped poly silicon is normally used for this electrode material. The polysilicon is heavily doped to control the work function, and etched away from the bottom of the trench and the top of the pedestal. An additional trench etch is performed to remove the residual threshold adjust implant from the bottom of the trench; and recesses the poly from the top of the pedestal. This processing results in the section presented in FIG. 4D.

Figure 4E:
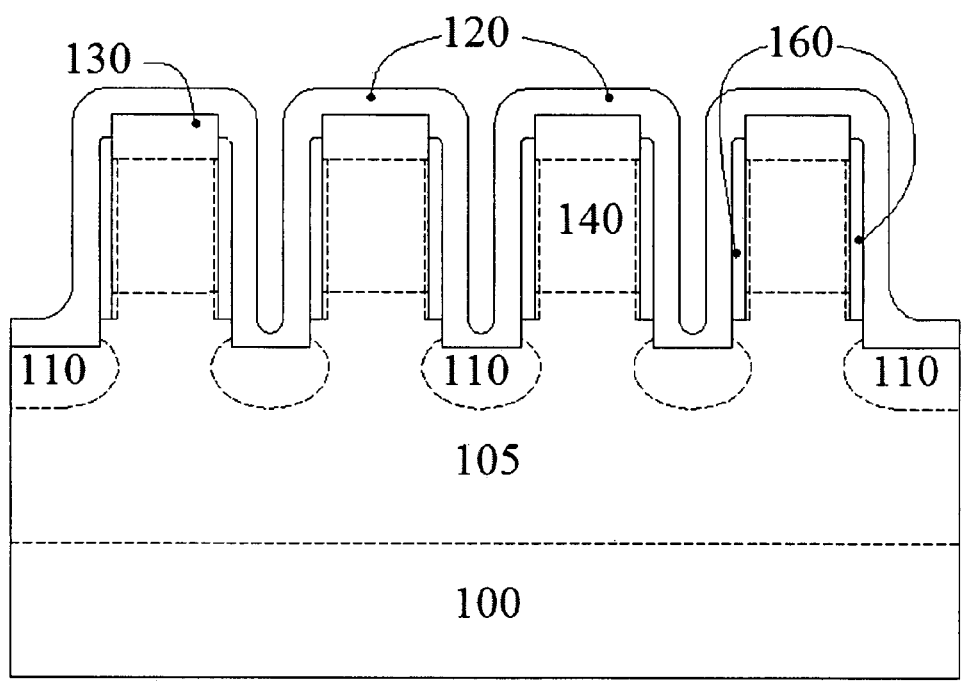
FIG. 4E is a cross section illustrating the metallization resulting in the final device profile.

An additional P-type implant 110 follows, to provide electrical isolation in the trench bottom, and to enhance the reverse bias voltage breakdown characteristics of the device. Following this implant a thermal process is used to electrically activate the various dopants, after which the metallization 120 is applied resulting in the final device profile, FIG. 4E.

In the exemplary N-channel field effect device, the anode is the drain and the cathode is the source. In that regard, the source and drain labels, as used herein and in the claims to follow, refer to the source as being that region (105 or 130) that is the source of the charge carriers when the diode is turned on or conducting, and with the drain being the other region (130 or 105) of the same conductivity type. Therefore, the charge carriers flow from the source through the channel to the drain during conduction. In the case of the exemplary N-type devices disclosed herein, conduction occurs when the drain 130 (anode) is at a higher voltage than the source 105 (cathode). With the foregoing definition of source and drain, it will be noted that regardless of the conductivity type, the backgate 140 is connected to the drain, not the source. This is to be compared to a conventional integrated circuit structure wherein the backgate is connected to the source.

According to the foregoing, region 105 has been identified as the source, independent of the conductivity type. As alternate embodiments to enhance the breakdown voltage, region 105 may be a source drift region, in which case region 100 would be the source contact.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A field effect semiconductor diode comprising:
   semiconductor layers on an upper surface of a substrate and forming a source, a body, and a drain of a field effect device, the semiconductor layers being stacked vertically and forming pedestals having an insulating layer and a gate on sides thereof vertically spanning a part of the source and drain layers and spanning the body separating the source and drain layers, the drain layer being the top layer;
   a conductive contact layer over the pedestals making electrical contact with the top layer and the gate;
   the conductive layer also being in contact with the body through at least one discontinuity in the drain layer.

2. The diode of claim 1 wherein the drain layer is an implanted layer.

3. The diode of claim 1 wherein the drain layer is a discontinuous doped layer, the body layer extending between the discontinuous doped layer to be in electrical contact with the conductive layer.

4. The diode of claim 3 wherein the drain layer is an implanted layer.

5. The diode of claim 1 further comprised of a breakdown enhancement doping between pedestals.

6. The diode of claim 5 wherein the breakdown enhancement is implanted.

7. The diode of claim 1 wherein the source is coupled to the body through a source drift region, the insulting layer and the gate on sides of the pedestals vertically spanning a part of the source by spanning part of the source drift region.

8. The diode of claim 1 wherein the field effect device is an N-channel device and the top layer is the drain.

9. The diode of claim 1 wherein the field effect device is an P-channel device and the top layer is the drain.

10. A field effect semiconductor diode comprising:
    semiconductor layers on an upper surface of a substrate and forming a source, a drift region, a body and a drain of a field effect device, the semiconductor layers being stacked vertically and forming elongate pedestals having an insulating layer and a gate on sides thereof vertically spanning a part of the source and drain layers and spanning the body separating the source and drain layers, one of the source and drain layers being the top layer;
    a conductive contact layer over the pedestals making electrical contact with the drain and the gate;

the conductive layer being in contact with the body through discontinuities in the top layer at selected positions along each pedestal.

11. The diode of claim 10 wherein the top layer is implanted.

12. The diode of claim 10 wherein the top layer is a discontinuous doped layer, the body layer extending between the discontinuous doped layer forming the source layer to be in electrical contact with the conductive layer.

13. The diode of claim 12 wherein the top layer is implanted.

14. The diode of claim 10 further comprised of a breakdown enhancement doping between pedestals.

15. The diode of claim 14 wherein the breakdown enhancement is implanted.

16. The diode of claim 10 wherein the source is coupled to the body through a source drift region, the insulating layer and the gate on sides of the pedestals vertically spanning a part of the source by spanning part of the source drift region.

17. The diode of claim 10 wherein the field effect device is an N-channel device.

18. The diode of claim 10 wherein the field effect device is an P-channel device.

* * * * *